United States Patent [19]
Antson

[11] 4,380,867
[45] Apr. 26, 1983

[54] METHOD FOR MAKING ELECTRICALLY CONDUCTIVE PENETRATIONS INTO THIN FILMS

[75] Inventor: Jorma O. Antson, Espoo, Finland

[73] Assignee: Oy LohJa AB, Virkkala, Finland

[21] Appl. No.: 281,668

[22] Filed: Jul. 9, 1981

[30] Foreign Application Priority Data

Aug. 1, 1980 [FI] Finland .................... 802420

[51] Int. Cl.³ .................................. H01L 27/14
[52] U.S. Cl. .............................. 29/590; 29/587; 29/591
[58] Field of Search ............. 29/587, 590, 578; 427/88, 89; 357/17, 19, 41, 68; 228/178, 179, 180 A, 180 R; 148/1.5

[56] References Cited

U.S. PATENT DOCUMENTS

2,842,831  7/1958  Pfann ........................... 29/578
3,361,592  1/1968  Quetsch, Jr. et al. ........... 427/89

*Primary Examiner*—L. Dewayne Rutledge
*Assistant Examiner*—David A. Hey
*Attorney, Agent, or Firm*—Fitzpatrick, Cella, Harper & Scinto

[57] ABSTRACT

Disclosed herein is a method for making electrically conductive penetrations into thin films and equivalent. The penetrations reach from the outside surface of the thin films to be grown by means of depostion as layers at a temperature of 200° to 700° C. to an interior electrode layer. According to the method a desired quantity of a metallic substance whose melting point is lower and boiling point higher than the growing temperature of the thin film layers is placed on the interior electrode layer within each desired penetration area before the preparation of the following layer. Hereby the metallic substance, when being molten, prevents the formation of layers in the area above itself and, when hardening, forms the desired electrically conductive penetrations.

11 Claims, 1 Drawing Figure

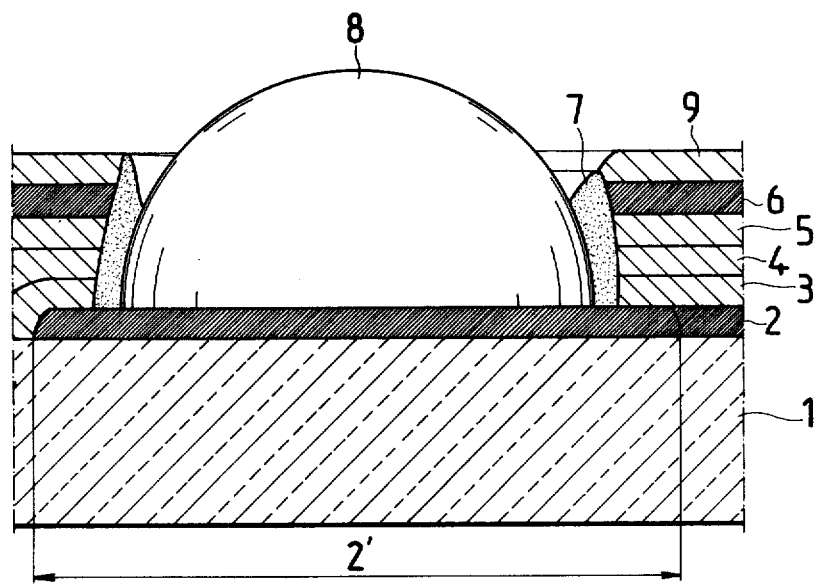

METHOD FOR MAKING ELECTRICALLY CONDUCTIVE PENETRATIONS INTO THIN FILMS

The present invention concerns a method for making electrically conductive penetrations into thin films and equivalent, structures particularly from the outside surface of thin films, grown by means of deposition as layers at a temperature of 200° to 700° C. to at least one interior layer. The interior layer is preferably an electrode layer, and the method is performed such that a quantity of metallic substance is placed on said interior layer, within each desired penetration area, before the preparation of the following layer.

Conductive penetrations in thin films are required mainly in electronic components in which electricity must be conducted through passivation films, or in multilayer thin films prepared by means of thin film techniques wherein the penetration must communicate down to lower conductor layers.

The method which has been used most commonly for making penetrations is based on the etching technique. At the desired penetration points (contact areas), the thin film exposed to the etching medium (chemical etching solutions, plasma) is selectively etched down to the desired lower conductor film while the rest of the surface, being protected e.g., by a photoresist, is passive to the effect of the etch concerned.

Another commonly used method is the so-called "life-off" technique, wherein an auxiliary film is formed within the penetration area immediately on the conductor film, onto which auxiliary film the upper thin-film layers are grown. Hereupon the penetration is produced by dissolving or by mechanically scratching the auxiliary film loose, whereby the thin film built on the auxiliary film are detached at the same time. The conductor film is exposed, whereby contact with this conductor layer is possible.

A problem of the etching technique is the difficulty of finding the selective etches at each particular time suitable for the different layers so that the etching is stopped at the desired conductor layer. As a rule, a very precise control is required in order to stop the etching exactly at the correct moment. Particularly in the case of large-area display components it is difficult to protect completely the surface part outside the contact areas from the effect of the etch, because, owing to dust particles and other disturbing factors, a photoresist always includes a considerable number of defect points. Through these the etching effect may reach an undesired active area of the display surface, having a detrimental effect on the yield and quality of the components to be manufactured.

A problem of the "lift-off" technique is often how to find an appropriate auxiliary film that endures the subsequent thin film process steps unchanged. It should also be noted that thin films grown at elevated temperatures are usually dense and firm, so that the solvents cannot affect the auxiliary films that have remained underneath, The detaching result is typically scaling and indefinite, and it is frequently difficult to remove the film completely. On the other hand, owing to their degree of coarseness, mechanical methods (grinding, scratching) are, as a rule, not usable.

The object of the present invention is to eliminate the drawbacks present in the prior art techniques mentioned above and to provide a method of an entirely new type for making electrically conductive penetrations into thin films.

The method in accordance with the invention can be applied, e.g., to the manufacture of thin film electroluminescent display components. Such a display component comprises a multi-layer thin film structure, wherein the conductive penetration shall be brought through a passivation layer to an upper conductor layer and through the passivation layer and through insulation and semiconductor layers to a lower (transparent) conductor layer.

The method in accordance with the invention is based on the idea that a quantity of a metal or metallic substance of low melting point but of high boiling point is placed onto the penetration area (contact area) before the thin films to be penetrated are processed. When the thin film growing takes place at an elevated temperature at which the metal remains molten, the atoms (molecules) colliding against the metallic surface cannot form a unified film because the molten surface is in a powerful thermic movement and is scaled clean. The thin film is grown normally on the rest of the surface provided that, at the growing temperature, impurity atoms are not evaporated to a harmful extent from the molten metal into the environment. This is possible with metals that have a high boiling point (i.e., a low vapour pressure at the growing temperature). After the thin film processes there is a connection to the desired conductor layer transmitted by the contact metal within the contact area. The thin film material in this area forms a slag layer in the border region of the metal. Elsewhere, the conductor layer is covered by a regular thin film structure. No subsequent operations are required in order to ensure penetration.

More specifically, the method in accordance with the invention is characterized by using such a metallic substance whose melting point is lower and boiling point higher than said growing temperature of the layers, whereby the metallic substance, when being molten, prevents the formation of layers above itself and, when hardening, forms the desired electrically conductive penetrations.

By means of the invention, remarkable advantages are achieved. Thus, the method in accordance with the invention eliminates the expensive and critical photolithography/etching step in the process of manufacture of the component, as a result of which the yield and quality of the components are improved. On the whole, the method involves no critical steps and does not require any precise control, which is the case in etching methods. Moreover, the method is "production-minded". The metal islands (nodes) produced in connection with the method at the same time form ready contact supports for the wiring outwards from the component.

The invention will be examined below in more detail, reference being made to the exemplifying embodiment in accordance with the attached drawing.

This drawing is an enlarged and partly schematical cross-sectional view of a penetration produced into a thin-film structure by means of the method in accordance with the invention.

In the following example process the conductive penetrations required in a thin-film electroluminescent display component are made of indium metal (In). In the structure shown in the drawing, onto the surface of a transparent indium-tin oxide (ITO) conductor 2 disposed on a glass substrate 1, within the contact area 2', a quantity of indium metal 8 has been dosed. The melting point of indium is 156.2° C., and the thin films 3 (Al$_2$O$_3$), 4 (ZnS:Mn), 5 (Al$_2$O$_3$), and 6 (ITO) deposited thereupon have been processed at 500° C. in a process of the CVD (Chemical Vapour Deposition) type. The indium metal 8 is then molten, and since its boiling point is high (2000° C.), its own vapour pressure at the process temperature is lower than 10$^{-7}$ torr. From the side surfaces of the molten indium 8, the materials forming the thin films are scaled to the peripheral area to form a layer of slag 7, whereas the contact area remains open. Owing to the low vapour pressure of indium, no detrimental effect on the growing films occurs. The good adhesion of indium to the ITO film 2 permits the keeping of the substrates 1 in an arbitrary position during the process. After the thin film processes the contact to the lower ITO conductor layer 2 is transmitted straight through the indium metal without any particular subsequent operations. After the upper ITO conductor film 6 has been patterned, indium metal is dosed onto the contact areas of the surface conductor 6, and the penetration through the Al$_2$O$_3$ passivation layer 9 of a thickness of about 1 μm, to be grown under the process conditions indicated above, is formed in the way described above.

The method in accordance with the invention may, of course, also be applied in a way differeing from the exemplifying embodiment described above, Thus, metals that resemble indium and have a low melting point and a high boiling point are also tin (Sn: m.p. 231.9° C.; b.p. 2270° C.) and gallium (Ga: m.p. 29.8° C.; b.p. 2237° C.). These are possible respective penetration metals when the temperature of the thin film process exceeds 232° C. (when tin is used) and 30° C. (when gallium is used).

In addition to electroluminescent thin films. the method in accordance with the invention may also be applied, e.g., to penetrations to be made into Si$_3$N$_4$ etc. films used in IC-circuits.

In principle, it is possible within the scope of the invention to use any metallic substance whatsoever whose melting point is lower and boiling point higher than the temperature of growing of the film layers to be penetrated. In such cases, various alloys of indium tin, and gallium can be combined with two of them or all of them together, as well as other metal alloys.

On the basis of experiments, pure indium has been found to be the best material in itself, owing to its good penetration properties. When alloys of indium and tin were tested, good results were obtained with alloys in which the content of tin was at the most about 80 percent by weight. The use of tin is justified owing to its good soldering properties and its lower cost.

Further, it should be mentioned that, in stead of the indium-tin oxide (ITO) mentioned in the exemplifying embodiment, tin-dioxide-antimony (SnO$_2$/Sb) or other metals in general e.g., Au, Al, Cr, or Mo) are also suitable for the material of the conductive layer 2, 2'.

The metallic material is placed onto the desired area of penetration most appropriately by means of evaporation through a mask or, in a way known per se, by soldering.

What is claimed is:

1. A method for making electrically conductive penetrations into an interior layer of thin films, particularly from the outside surface of thin films grown by means of deposition as layers at a temperature of 200° to 700° C., comprising placing a metallic substance on said interior layer within each desired penetration area before the preparation of the following layer, wherein such a metallic substance is used whose melting point is lower and boiling point higher than said growing temperature of the layers, and growing at least one additional layer on said interior layer, whereby the metallic substance, which is molten at said growing temperature prevents the formation of layers above itself and, when hardening, forms the desired electrically conductive penetrations.

2. A method as claimed in claim 1, wherein the metallic substance is selected from the group consisting of indium, tin, and gallium.

3. A method as claimed in claim 1, wherein said metallic substance comprises a metal alloy.

4. A method as claimed in claim 3, wherein an alloy of indium and tin is used.

5. A method as claimed in claim 4, wherein the proportion of tin in the alloy is at the most 80 percent by weight.

6. A method as claimed in claim 3, wherein an alloy of tin and gallium is used.

7. A method as claimed in claim 3, wherein an alloy of indium and gallium is used.

8. A method as claimed in claim 3, wherein an alloy of indium, tin, and gallium is used.

9. A method as claimed in claim 1, wherein the metallic substance is placed onto the desired area of penetration by evaporation through a mask.

10. A method as claimed in claim 1, wherein the metallic substance is placed onto the desired area of penetration by soldering.

11. A method as claimed in claim 1, wherein said interior layer comprises an electrode.

* * * * *